(12) United States Patent
Pressley et al.

(10) Patent No.: US 6,943,569 B1
(45) Date of Patent: Sep. 13, 2005

(54) METHOD, SYSTEM AND APPARATUS TO DETECT DEFECTS IN SEMICONDUCTOR DEVICES

(75) Inventors: Laura Pressley, Austin, TX (US); David E. Brown, Austin, TX (US); Travis Lewis, Austin, TX (US); Edward E. Ehrichs, Austin, TX (US); Paul R. Besser, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 121 days.

(21) Appl. No.: 10/121,252

(22) Filed: Apr. 12, 2002

(51) Int. Cl.[7] ............... G01R 27/08; G01R 31/302; G01R 31/305
(52) U.S. Cl. ............... 324/691; 324/750; 324/751
(58) Field of Search ............... 324/750, 751, 324/691, 501; 716/19–21; 382/145

(56) References Cited

U.S. PATENT DOCUMENTS

| | | | | |
|---|---|---|---|---|
| 4,387,304 | A | * | 6/1983 | Younkin ............... 250/492.2 |
| 5,054,097 | A | * | 10/1991 | Flinois et al. ............... 382/294 |
| 5,652,180 | A | * | 7/1997 | Shinriki et al. ............... 438/620 |
| 6,091,249 | A | * | 7/2000 | Talbot et al. ............... 324/751 |
| 6,143,628 | A | * | 11/2000 | Sato et al. ............... 438/455 |
| 6,458,703 | B2 | * | 10/2002 | Endo et al. ............... 438/688 |
| 6,484,064 | B1 | * | 11/2002 | Campbell ............... 700/100 |
| 6,504,393 | B1 | * | 1/2003 | Lo et al. ............... 324/765 |
| 6,618,850 | B2 | * | 9/2003 | Nishiyama et al. ............... 716/20 |
| 6,664,541 | B2 | * | 12/2003 | Nasser-Ghodsi et al. ... 250/310 |

OTHER PUBLICATIONS

Michael C. Madden et al., "High Resolution Observation of Void Motion in Passivated Metal Lines Under Electromigration Stress," Mat. Res. Soc. Symp. Proc. vol. 265, 1992; pp. 33-38.

T. N. Marieb et al., "Direct Observation of the Growth and Movement of Electromigration Voides Under Passivation," SRC Pub C93413; Aug. 1993; 15 pp.

N. E. Meier et al., "In-Situ Studies of Electromigration Voiding in Passivated Copper Interconnects," CP491, Stress Induced Phenomena in Metallization: Fifth Intern'l Workshop; 1999 American Institute of Physics, 3 pp.

Klaus Wetzig et al., "In-Situ Study of Interconnect Failures by Electromigration Inside a Scanning Electron Microscope, " Stress Induced Phenomena in Metallization: Fifth Intern'l Workshop; 1999 American Institute of Physics, pp. 89-99.

S. Lee et al., "Comparison of Stresses in Al Lines Under Various Passivations," Materials Reliability in Microelectronics VII, Mat. Res. Soc. Symp. Proc. vol. 473; 1997, pp. 415-420.

(Continued)

*Primary Examiner*—Anjan Deb
*Assistant Examiner*—John Teresinski (57) ABSTRACT

A method and system to locate and detect voids in films that are involved in critical dimension (CD) structures and non-critical dimension structures in semiconductor devices are presented. One or more test structures (resolution devices) are formed on a semiconductor wafer. A scanning electron microscope is operated in voltage contrast mode to obtain a digital representation of the test structure. The voltage contrast image of the test structure is then analyzed with a system which automates the location, identification, and categorization of voids in the test structure. Additionally, the method is more sensitive to electrical marginalities caused by voids than other wafer electrical testing methods. The method is suitable inline monitoring during a manufacturing process by utilizing the automation of void identification, location, and categorization as a process monitoring parameter.

10 Claims, 4 Drawing Sheets

OTHER PUBLICATIONS

Samantha Lee et al., "The Effects of Passivation Thickness and Initial Aluminum Line Stress on Electromigration Behavior," Materials Reliability in Microelectronics VII, Mat. Res. Soc. Symp. Proc. vol. 516; 1998, pp. 259-254.

Paul R. Besser et al., "Strain Relaxation and In-Situ Observation of Voiding in Passivated Aluminum Alloy Lines," Mat. Res. Soc. Symp. Proc. vol. 308; 1993, pp. 249-254.

Paul R. Besser et al., "Measurement and Interpretation of Strain Relaxation in Passivated Al—0.5% Cu Lines," J. Mater, Res., vol. 11, No. 1, Jan. 1996; Materials Research Society, pp. 184-193.

Paul R. Besser et al., "In Situ Scanning Electron Microscopy Observation of the Dynamic Behavior of Electromigration Voids in Passivated Aluminum Lines," J. Appl. Phys. 72(8), Oct. 15, 1992, Amer. Inst. of Physics, pp. 3792-3797.

* cited by examiner

Array Value Representation 401

FIGURE 4

METHOD, SYSTEM AND APPARATUS TO DETECT DEFECTS IN SEMICONDUCTOR DEVICES

FIELD OF THE DISCLOSURE

The present invention relates generally to monitoring of of a semiconductor process, and more particularly to the use of an electron beam device in the semiconductor manufacturing industry.

BACKGROUND

The very large scale integration (VLSI) era and, in particular, the 1990s ultra large scale integration (ULSI) circuit integration era require the integration of a million or more circuit components per device (i.e., die). Realizing the ULSI era has required decreasing critical dimensions (CDs) accordingly, and has presented challenges in manufacturing, yield enhancement, and defect detection process areas. As semiconductor geometries shrink, the need for monitoring of critical dimensions (CDs) to achieve precise control over feature size dimensions has grown. The use of optical techniques for monitoring CDs has become less practical, even in the ultraviolet (UV) range, because of the resolution limits inherent with optical diffraction. To overcome the limitations of optical techniques, scanning electron microscope-based inspection processes are generally used for current era integrated circuit critical dimension metrology and defect inspection in wafer fabrication facilities.

In addition to their conventional use to monitor CDs, scanning electron microscopes (SEMs) and electron beam probers, an adaptation of the SEM for functional probing of structures in IC devices, are utilized to obtain voltage contrast images of devices. In a voltage contrast image, the voltage of a structure undergoing imaging determines the brightness of that structure in the image. This is achieved by selective energy filtering to control the detection of secondary electrons, which enhances the voltage contrast. For semiconductor wafers, the SEM voltage contrast method has been proposed for detection of electrical defects that electrically isolate or ground structures.

Various commercial electron-beam wafer inspection systems such as KLA-Tencor's SEMSpec and Analytical Solutions' ISI WB-6 SEM have also been developed to use voltage contrast methods to find "killer" electrical defects and nuisance defects. Killer electrical defects adversely affect the operation of a completed integrated circuit (IC), while "nuisance" defects may not adversely affect the performance of a completed IC. Because nuisance defects are much more numerous than killer defects, it is especially time-consuming to electrically test all of these defects to determine the final performance impact on the IC. KLA-Tencor, Analytical Solutions, and other similar commercial systems have been used in conjunction with digital image processing computers to automate location of killer and nuisance electrical defects, as well as to conduct failure analysis of integrated circuits due to killer and nuisance electrical defects.

However, none of the commercial systems presently available which use the SEM voltage contrast method are configured to purposely detects voids in films, unless the void is of such large dimension that an obvious open or short electrical defect is manifested. However, many voids can be less than 30 nm in size, and are on the order of film roughness dimensions. Small voids in films may result in marginal resistance or resistance gradients between device structures, and give rise to reduced device performance and reduction in process yields.

Therefore what is needed is a system suitable for inspecting semiconductor wafers in a production environment which provides improved feedback that does not suffer from the known limitations, and which is capable of revealing small hidden voids.

BRIEF DESCRIPTION OF THE DRAWINGS

Other advantages, features and characteristics of the present invention, as well as methods, operation and functions of related elements of structure, and the combinations of parts and economies of manufacture, will become apparent upon consideration of the following description and claims with reference to the accompanying drawings, all of which form a part of the specification, wherein like reference numerals designate corresponding parts in the various figures, and wherein:

DETAILED DESCRIPTION OF THE FIGURES

FIGS. 1–4 illustrate a method and system for use in a production environment to locate and detect voids in films that are involved in critical dimension (CD) and non-critical dimension structures, e.g., line widths, thicknesses and spaces, which can cause yield or processor speed degradation in semiconductor devices. In one embodiment, the invention is implemented by the addition of one or more test structures (resolution devices) formed on a semiconductor wafer. A scanning electron microscope (SEM) is operated in voltage contrast mode to obtain a digital representation (i.e., image) of the test structure, and the image of the test structure is then analyzed to locate, identify, and categorize voids in the test structure. While manual identification/categorization of voids in the image of the test structure is possible with reasonable accuracy, a further embodiment of the present disclosure provides a system which automates the identification and categorization of voids on the digital representation of the test structure with a very high degree of accuracy. In the following description, numerous specific details are set forth to provide a thorough description of the invention. However, it will be apparent to one skilled in the art that the invention may be practiced without these specific details, or with other specific details. In other instances, well-known features have not been described in detail so as not to obscure the invention.

Figure 1:
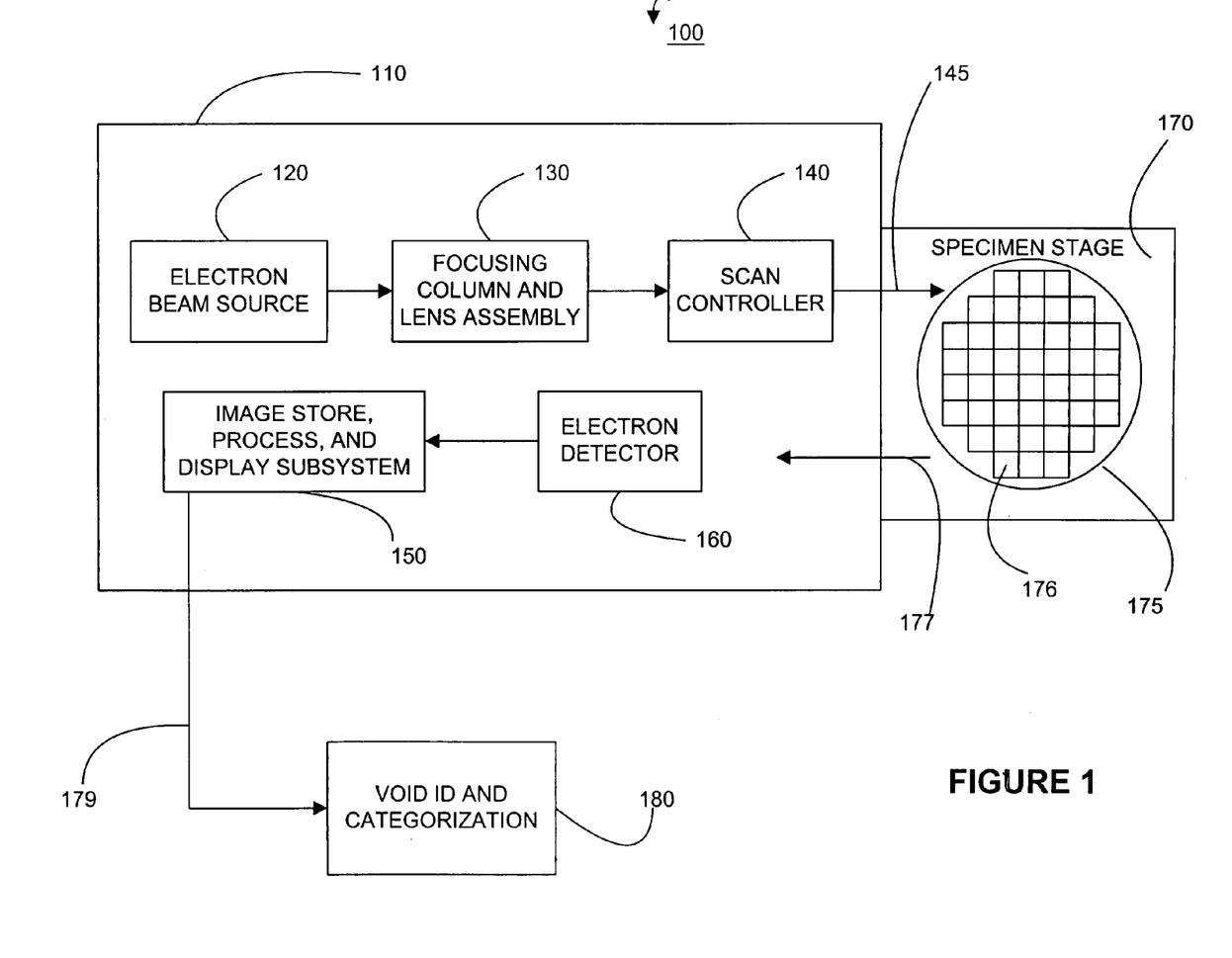
FIG. 1 is a simplified block diagram of a system capable of voltage contrast mode operation in accordance with an embodiment of the present invention.

Referring to FIG. 1, a simplified block diagram of a system capable of void detection using voltage contrast mode operation is depicted, and designated generally by reference numeral 100. The illustrated embodiment of system 100 includes an electron microscope sub-system 110, which further includes an electron beam source 120, a focusing column and lens assembly 130, a scan controller 140, a specimen stage 170, an electron detector 160, and an image storing, processing and display sub-system 150. Void ID and categorization portion 180 is illustrated as a stand-alone application receiving a signal 179 from image storing, processing and display system 150 in FIG. 1, however, void ID and categorization portion 180 could be incorporated into image storing, processing and display sub-system 150 as an additional capability of image storing, processing and display sub-system 150 if desired. Void ID and categorization portion 180 may also employ separate processing, display and storage systems, which are not illustrated in FIG. 1. For example, void ID and categorization portion 180 could include a computer workstation for processing data received from image storing, processing and display sub-system 150, with subsequent data analysis output from void ID and categorization portion 180 to a manufacturing database or an historical database, or to a monitor or printer.

During operation, electron beam source 120 is used to generate an electron beam 145, which is focused by focusing column and lens assembly 130. Scan controller 140 is used to scan electron beam 145 across selected regions of specimen 175. The specimen stage 170 supports a specimen 175. Specimen 175 may be comprised of a variety of materials, with the present disclosure particularly applicable to semiconductor materials, e.g., wafers. Small area 176 of specimen 175 is illustrated to indicate that a particular area of interest, e.g., a die, or a portion of a die, or a test structure, can be examined to ascertain features of the specimen 175 in the image of small area 176. Electron detector 160 detects the secondary and/or backscatter electron signal 177 from specimen 175 or small area 176. Electron detector 160 may be of various types that are well known in the art, e.g., semiconductor diode, scintillator/photomultiplier assembly, micro-sphere plate, etc. When electron signal 177 is received by electron detector 160, signal 277 is sent to image storing, processing, and display sub-system 150 for processing, data storage and/or display.

In various embodiments of the present disclosure, small area 176 is a structure such as a poly silicon test structure having a serpentine shape, or N+ or P+ doped poly silicon structures. In a preferred embodiment, digital representations (images) of these various structures obtained from image storing, processing and display sub-system 150 are analyzed by void ID and categorization system 180 to automatically detect and categorize ultra small film voids at or below a critical dimension (CD), which may range from about 1 to about 50 nm. These ultra small film voids are undetectable with conventional detection means. As line widths in devices are reduced below 80 nm, these ultra small voids in, for example, metal silicide and salicide films, will limit the operating speed of the devices, as well as adversely impact device yield during manufacture. Embodiments of the method are eminently suitable for conducting quantitative, inline evaluation of front end of line (FEOL) processes, i.e., operations performed on a wafer during the course of manufacturing up to first metallization, as well as back end of line (BEOL) processes (those processes occurring after first metallization). For example, the method can be employed to detect voids that cause resistance marginalities or gradients in semiconductor device films due to void generation during processing methodologies such as silicide formation, salicide conversion, rapid thermal anneal (RTA) processing, copper films, seed barrier films, electroplated films, chemical vapor deposition (CVD) films, plasma vapor deposition (PVD) films, diffusion films, gate oxide films, etched films, wet-cleaned films, and others well known in the art. The method can detect very small voids in conducting films, insulating films, isolation oxides, interlayer dielectric films, semiconducting films, e.g. Si, GaAs, superconducting material films, e.g., YBCO films such as $YBa_2Cu_3O_7$, and bulk material films, e.g., Cu, Al . In a variety of cases, e.g., insulating films and salicide films, the method provides an easier, more efficient means of detecting voids and their corresponding electrical marginalities than other methods currently employed in the industry.

Figure 2:
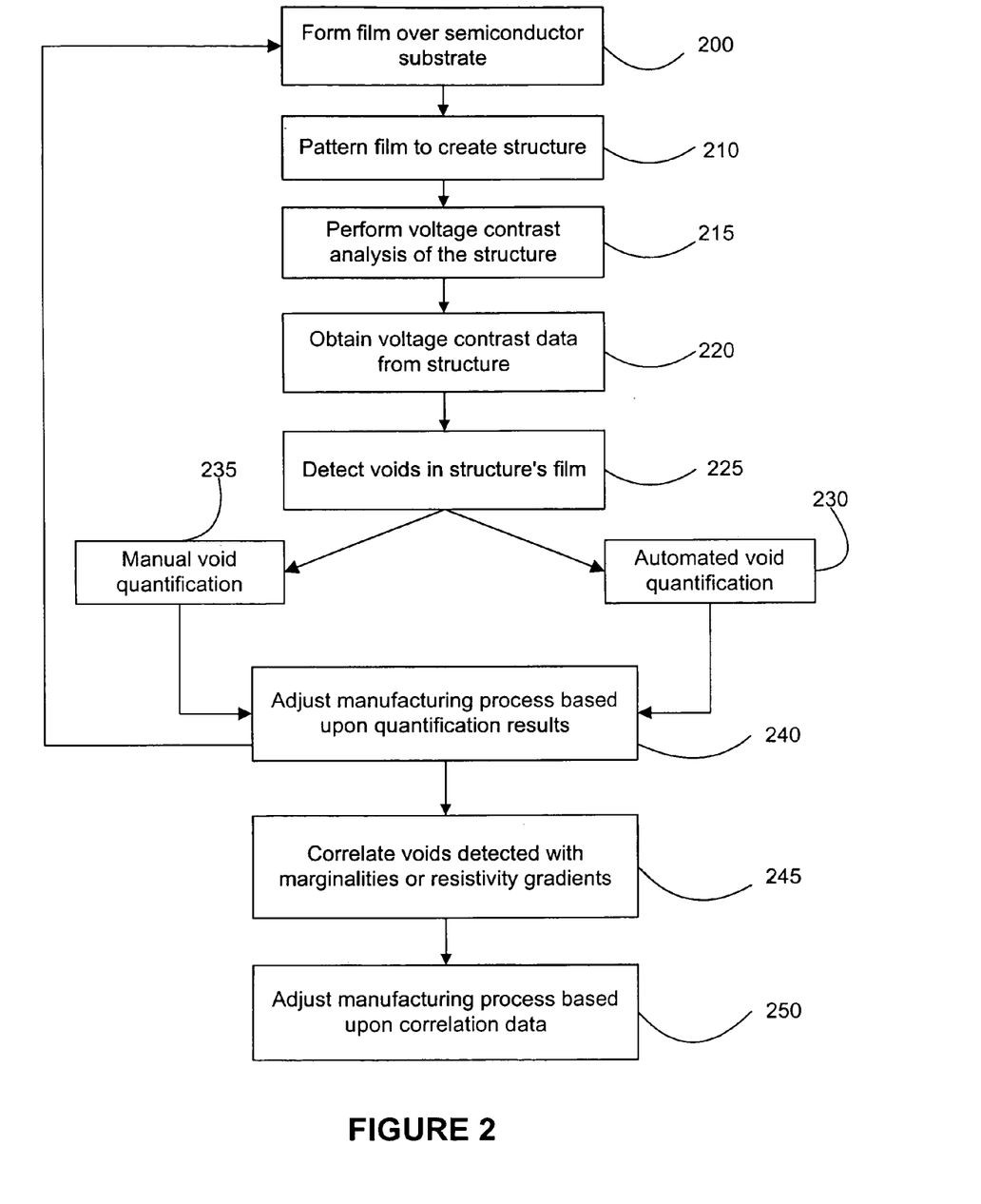
FIG. 2 is a flow diagram of an inline method for detecting voids resulting from various processing methodologies according to at least one embodiment of the present invention.

Referring to FIG. 2, a flow diagram of an inline method for detecting voids resulting from various processing methodologies, is presented. It should be noted that although the steps in FIG. 2 are described in a sequential order for purposes of illustration, some steps may be performed simultaneously with other steps, or some steps may be performed in a different order than shown in FIG. 2. It should also be noted that although the example presented with FIG. 2 references a test structure in the discussion of the method, functional components of the actual device, i.e., wires or lines comprising a specific portion of the die, could also be used to practice the method. It should be noted, however, that a sheet of film, a portion or portions of a film sheet, or an entire film sheet prior to patterning operations can serve as the test structure to detect voids according to the teachings of the present disclosure. Therefore the use of the phrase "test structure" and the examples presented herein are not meant to limit the application of this method to a specific shape or fabrication process occurrence during manufacture.

The method comprises forming a film over a semiconductor substrate in step 200. This film will serve as the test structure after patterning and etching in step 210. The film may include any material whose properties would serve as an indicator of manufacturing circumstances or processing methodologies. For example, in an embodiment where semiconductor devices undergoing manufacture utilize a dual damascene copper process, the film material of choice for the test structure would be a film containing a copper alloy. As a further example, in embodiments wherein semiconductor devices employ cobalt silicide, nickel silicide, and the like during manufacture, the film material of choice could be material such as poly silicon, N+ doped poly silicon, or P+ polysilicon for the test structure.

In step 210, the film is patterned and etched to form a structure that will serve as a test structure for inline monitoring of process methodologies. Experiments conducted with various test structure shapes during semiconductor device manufacturing has shown that a test structure with serpentine features works very well, primarily due to its large surface area. It should be noted, however, that test structure shapes other than serpentine may be utilized to practice the teachings disclosed herein. For example, some factors to consider when deciding upon a structural form or shape to use as a resolution device (test structure) are the size, i.e., critical dimension, and the characteristics of the material(s) used to fashion the resolution device structure. Generally, the critical dimensions of the features of the structure should be in the range of from about 1 to about 50 nm. Various patterning and etching techniques known to those of skill in the art can be used to produce the appropriate critical dimensions of the features of the structure. Test structures may be placed on any available free space at die sites on a semiconductor wafer. The total number of test structures to place at different die sites on a wafer can range from only a few to one test structure per die site, depending upon how many sampling sites are needed or desired. For mature processes, fewer test structures are generally needed, while processes that are not mature may require the use of many test structures for process monitoring.

In step 215, a wafer with test structures located thereon is placed in the SEM system for inspection in the voltage contrast mode. Voltage contrast data, which forms a digital representation (image) of the test structure, is acquired and/or stored by the imaging sub-system of the scanning electron microscope in step 220. While the analysis herein is described with reference to a specific test structure, the voltage contrast SEM technique disclosed herein can also be be used to analyze a sheet of film or a portion of a film sheet wherein the film sheet is of a material or materials which will ultimately have the desired features, i.e., critical dimension features. In step 225, the digital representation (image) of the test structure is reviewed to detect voids in the film of the test structure. The image of the test structure may be obtained from the imaging sub-system of the SEM, or from the embodied void ID and categorization portion of the SEM system. Voids in the film of a test structure may be manually quantified, as in step 235, or by the automated process of void ID and categorization system, as in step 230. Whether done manually or by automation, void quantification not only counts the total number of voids in the film of the test structure, but also categorizes the voids as one of two types: full voids, and partial voids. Full voids transverse completely across a feature in the test structure, while partial voids partially extend across a feature in the test structure. Full voids produce high resistance and are deleterious to yield, while partial voids may have a lesser effect on yield.

Manual quantification of voids in test structures as in step 235 is typically accomplished by contamination free manufacturing (CFM) personnel examining SEM photomicrographs of features in a test structure obtained in step 220. The CFM methodology attempts to quantify the integrated effects of full and partial voids by employing the concept of a "kill" rate, which is calculated as follows:

Average No. Voids/Die=[(No. Full Voids)+((No. Partial Voids)(X)]/Total Die Inspected Where X is a yield weighting factor of non-interger value, i.e.,0.26. Typically X is derived from another, similar (known) defect's value from the known defect's yield weighting factor.

While the manual quantification of voids in step 235 is possible with a reasonable degree of accuracy, the process can be time consuming and subject to interpretation errors by the person characterizing the data. A preferred embodiment is to utilize an automated process such as the embodied void ID and categorization portion of the SEM system to quantify the number of voids in the test structure, as in step 230, due to time savings and greatly increased accuracy over manual methodology.

Void ID and categorization analysis of voltage contrast data of test structures as disclosed herein may be conducted at various time splits during a manufacturing process to determine which part or parts of a manufacturing process results in unacceptable yields. Thus, the embodied method can serve as a highly accurate technique for efficient inline process monitoring and process development, as well as yield enhancement. Should the analysis of step 230 or step 235 reveal that some aspect of a manufacturing process results in an unacceptable level of voids in a test structure, or reveals changes that have occurred in an unacceptable manner (and hence voiding or changes to the device which the test structure serves to monitor), in step 240 manufacturing process parameters may be adjusted as necessary. After manufacturing process adjustments in step 240, the procedures of steps 200 through 230 could be repeated until an acceptable outcome is reached.

A further benefit of the disclosure embodied herein is that the method may be used to correlate voids detected in the film of a test structure with marginalities or resistivity gradients in semiconductor devices detected when a wafer undergoes a wafer electrical test (WET), as in step 245. Experiments with wafers containing the test structures as disclosed herein have revealed a definitive correlation between inline detected film voids and electrical marginality data obtained from wafer electrical testing. Wafer electrical test measures the electrical parameters (i.e., resistance, leakage current, continuity, etc.) of integrated circuits at the wafer level, generally to verify conformity to operational specifications. Wafers typically undergo electrical testing after FEOL processing (after first metal layer deposition and etch), as well as after BEOL processing (completion of manufacturing). Inline parametric tests generally use standard test structures for conducting these parametric tests. These WET test structures are commonly placed in the scribe line regions of a wafer, and are also used for process monitoring and control.

After performing steps 200 through 230 with a test structure as disclosed herein, electrical test measurements were conducted using the embodied test structure. Results indicated a strong correlation exists between yield limiting or speed limiting voids detected according to the present invention and electrical resistivity data obtained from electrical tests on the embodied test structure. A strong correlation also was found between total voids (full and partial voids) and electrical resistivity data with the embodied test structure. Correlation also exists between partial voids detected and electrical resistivity data with the embodied test structure. Hence the method as disclosed herein may be used to adjust a manufacturing process based upon the correlation data, as shown in step 250. Although film voids in a test structure may vary considerably in dimension, they are still detectable using the techniques disclosed herein. Experiments on salicides and doped polysilicon have demonstrated that the embodied method has greater sensitivity to electrical marginalities caused by voids than other wafer electrical testing methods. In a non-conductive film, conventional WET methods usually cannot detect partial voids, only full voids which result in shorting or large resistance changes. Because the present invention reveals a strong correlation between total voids and resistivity, it is a more sensitive metric for device performance and yield than is electrical wafer test data obtained by conventional methods, particularly in the case of salicides or other non-conductive or insulating films. In addition to increased sensitivity over current wafer electrical testing methods, the present invention also provides faster feedback to the process engineer than is possible through conventional electrical testing methods.

Figure 3:
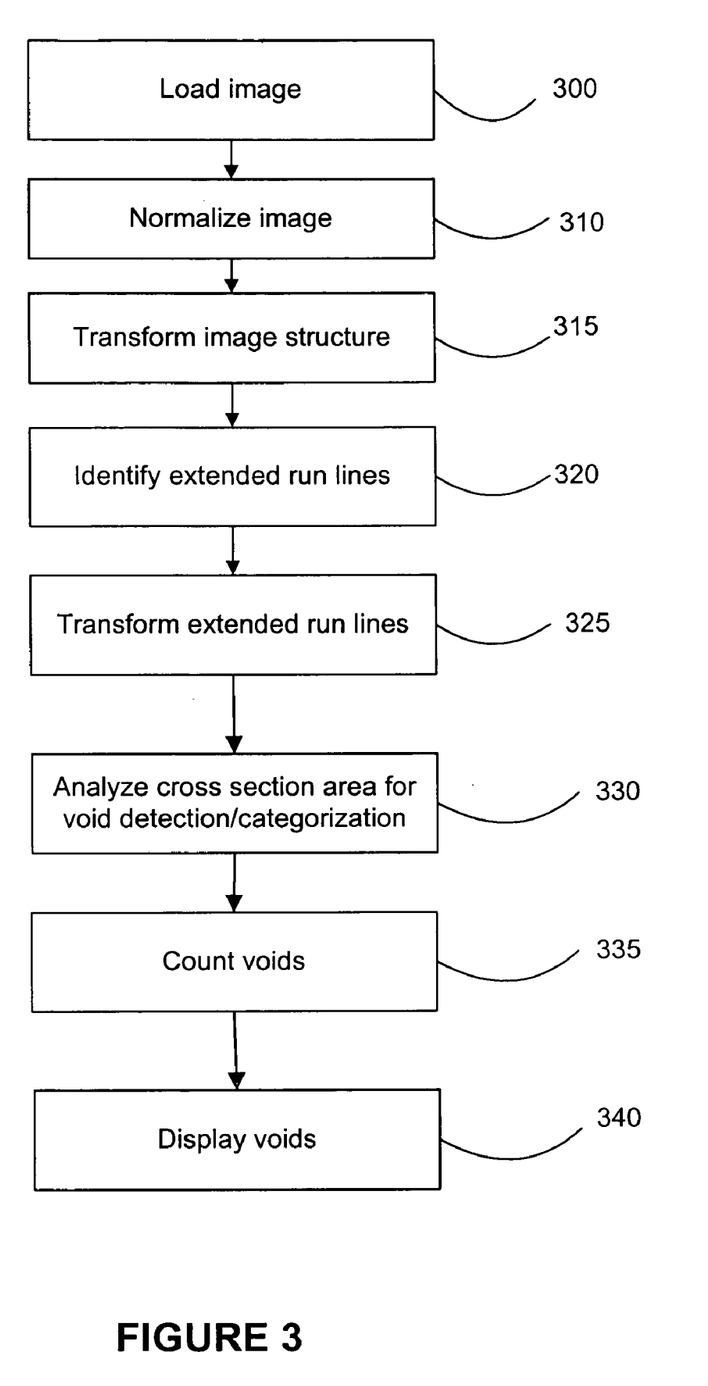
FIG. 3 is a flow diagram of a method for automation of void identification process according to at least one embodiment of the present invention.
Figure 4:
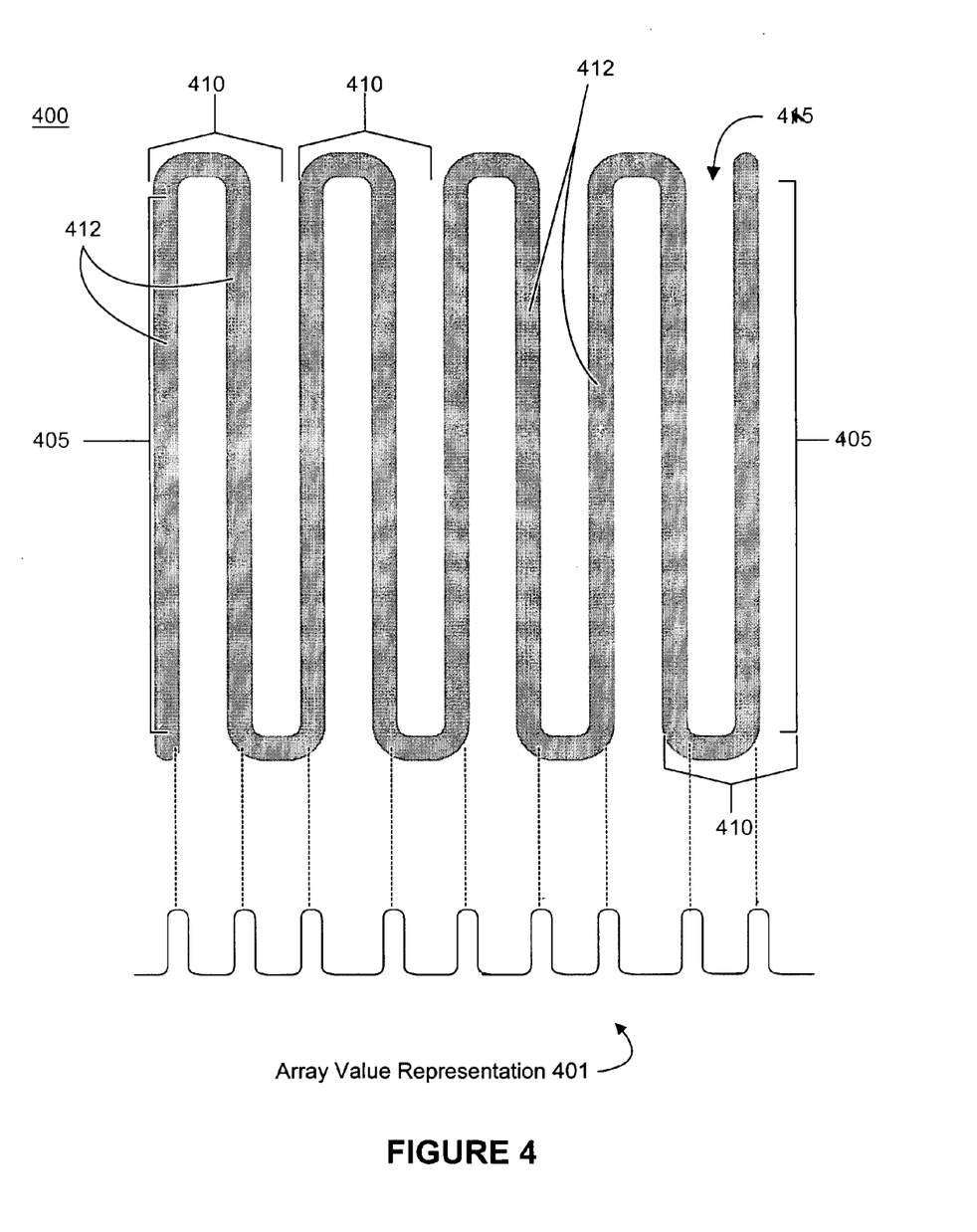
FIG. 4 is a line drawing symbolizing a serpentine-shaped structure illustrated in plan (top) and cross-sectional views according to at least one embodiment of the present invention.

Details of the data automation process of the embodied method are presented with reference to FIG. 3 and FIG. 4. FIG. 3 is a flow diagram of a method for automation of void identification according to an embodiment of the present disclosure. FIG. 4 is a line drawing symbolizing a photomicrograph of a serpentine-shaped structure 400 according to an embodiment of the present invention. As previously discussed, use of a serpentine shape is not necessary to practice the teachings of the present disclosure, however, for purposes of example to illustrate the technique, a serpentine-shaped structure 400 with extended run line features 405 and short run line features 410 (as viewed from left to right) representing poly silicon wires on a substrate is shown in FIG. 4. Lines 412 are a portion of extended run line features 405. Again, recall that the choice of material for the structure should be representative of the manufacturing process to be monitored, and therefore the use of poly silicon wire as line features 405, 412, and 410 in FIG. 4 is merely to serve as an example.

Referring to FIG. 3, in step 300, a digital representation (photomicrograph image data) of the structure to be analyzed, such as structure 400, is received and loaded into an array by the void ID and categorization portoin of SEM system (FIG. 1, item 180). The digital representation may be retrieved from an historical database, an engineering database, or any other database to which the tool (i.e., SEM) sends voltage contrast data (photomicrograph images). As used herein, the term array refers to computing. In computing, an array has its own name or identifier, and each member of the array is identified by a subscript used with the identifier. An array can be examined by a computer program and a particular item of information extracted by using this identifier and subscript.

After loading in step 300, the grayscale of the photomicrograph image (digital representation) is normalized in step 310 by executing a series of instructions to set the minimum pixel value to zero, then to set the dynamic range to a non-zero value. Following normalization, in step 315 the digital representation of the structure 400 is collapsed parallel to extended run lines 405, or transformed along a first axis, to create a one-dimensional array of data representing all of the features of structure 400, as is seen in the array value representation 401 (array correspondence to features 405, and 410 shown by dotted lines connecting features in 400). This is done to enable identification, in step 320, of each extended run line 405, determine the spatial extent of each extended run line 405, and to discriminate out short run lines 410 and other features such as troughs 415 that are not extended run lines 405 and are therefore not a portion of the structure of interest for void detection. An embodiment of the present disclosure also provides for detection of short run lines 410 in much the same manner as for that of extended run lines 405. In the case of a sheet of film or a portion of a sheet of film being used as the resolution device, in place of extended run lines 405, the user could define "virutal" long run lines (not illustrated) to apply the techniques taught herein. These virutal long runs would be analogous to a contiguous series of extended run lines 405 and would possess dimensionality (a thickness), thus enabling application of the method as disclosed by the present invention.

Following identification of extended run lines 405 in step 320, in step 325, an additional transformation is accomplished by collapsing the information of each extended run line 405 orthogonal to extended run line 405 into a second one-dimensional array in order to locate the voids. This permits analysis of the cross sectional areas of extended run lines 405 in step 330. The analysis of step 330 consists of subtracting the dc and low frequency components (slowly varying background) by applying a smoothing technique, e.g., an n-point moving average from the line values in the second array, where n=a desired integer for the smoothing interval, i.e., 5, 10, 25, et cetera, then subtracting this smoothed version of the line from the original line data. The system then executes instructions to identify all points in the processed data that are below some threshold. The points below the threshold are voids. The cross sections through each void are then analyzed to determine if the void is a complete void or a partial void by setting a threshold value. If a point value is greater than the threshold value, this represents a partial void. Point values above the threshold are full voids.

After void detection and categorization in step 330, the voids are counted in step 335. In step 340, the void count output is displayed. The void count output can be displayed in various ways, for example, a presentation in tabular format in a spreadsheet, or a digital representation (modified photomicrograph) showing the void locations. Void data can be selectively filtered such that a display of output could include total number of voids, full voids only, partial voids only, full voids for a particular time split, or other such options. The void output display filtering capability of the present invention provides yield management engineers with additional flexibility for trend analysis of a process.

The various functions and components in the present application may be implemented using an information-handling machine such as a data processor, or a plurality of processing devices. Such a data processor may be a microprocessor, microcontroller, microcomputer, digital signal processor, state machine, logic circuitry, and/or any device that manipulates digital information based on operational instruction, or in a predefined manner. Generally, the various functions, and systems represented by block diagrams are readily implemented by one of ordinary skill in the art using one or more of the implementation techniques listed herein. When a data processor for issuing instructions is used, the instruction may be stored in memory. Such a memory may be a single memory device or a plurality of memory devices. Such a memory device may be a read-only memory device, random access memory device, magnetic tape memory, floppy disk memory, hard drive memory, external tape, and/or any device that stores digital information. Note that when the data processor implements one or more of its functions via a state machine or logic circuitry, the memory storing the corresponding instructions may be embedded within the circuitry that includes a state machine and/or logic circuitry, or it may be unnecessary because the function is performed using combinational logic.

The method and apparatus herein provides for a flexible implementation. Although the invention has been described using certain specific examples, it will be apparent to those skilled in the art that the invention is not limited to these few examples. For example, the disclosure is discussed herein primarily with regard to void detection in the SEM voltage contrast mode, however, the invention can be used in other modes or processes that use beams of energetic, charged particles, such as electron beam induced current isolation (EBIC) imaging systems. Additionally, various types of electron beam devices are currently available which could be suitable for use in employing the method as taught herein, e.g., HVSEM, TEM, STEM, and the like. Note also, that although an embodiment of the present invention has been shown and described in detail herein, along with certain variants thereof, many other varied embodiments that incorporate the teachings of the invention may be easily constructed by those skilled in the art. Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. Accordingly, the present invention is not intended to be limited to the specific form set forth herein, but on the contrary, it is intended to cover such alternatives, modifications, and equivalents, as can be reasonably included within the spirit and scope of the invention.

What is claimed is:

1. A method comprising:
   receiving a digital representation of a structure based on a voltage contrast analysis;
   transforming the digital representation of the structure along a first axis to create a first one dimensional array;
   determining a location of a specific portion of the structure based upon the first one dimensional array;
   transforming a portion of the digital representation along a second axis corresponding to the location of the specific portion to create a second one dimensional array, wherein the first axis is orthogonal to the second axis; and
   identifying a location of a void based upon the second one dimensional array.

2. The method of claim 1, wherein receiving a digital representation further comprises:
   receiving a voltage contrast image of the structure; and
   normalizing a grayscale of the digital representation.

3. The method of claim 1, wherein identifying further includes identifying full void locations.

4. The method of claim 1, wherein identifying further includes identifying partial void locations.

5. The method of claim 1 further comprising:
   adjusting a manufacturing process parameter based at least partially upon identifying.

6. A system comprising:
   means for receiving a digital representation of a structure based on a voltage contrast analysis;
   means for transforming the digital representation of the structure along a first axis to create a first one dimensional array;
   means for determining a location of a specific portion of the structure based upon the first one dimensional array;
   means for transforming a portion of the digital representation along a second axis corresponding to the location of the specific portion to create a second one dimensional array, wherein the first axis is orthogonal to the second axis; and
   means for identifying a location of a void based upon the second one dimensional array.

7. The system of claim 6, wherein the means for receiving a digital representation further comprises:
   means for receiving a voltage contrast image of the structure; and
   means for normalizing a grayscale of the digital representation.

8. The system of claim 6, wherein the means for identifying further includes means for identifying full void locations.

9. The system of claim 6, wherein the means for identifying further includes means for identifying partial void locations.

10. The system of claim 6 further comprising:
    means for adjusting a manufacturing process parameter based at least partially upon the means for identifying.

* * * * *